US008905290B2

(12) United States Patent
Choi et al.

(10) Patent No.: US 8,905,290 B2
(45) Date of Patent: Dec. 9, 2014

(54) APPARATUS FOR MOUNTING SEMICONDUCTOR CHIPS ON A CIRCUIT BOARD

(71) Applicant: Samsung Electronics Co., Ltd., Suwon-si (KR)

(72) Inventors: Il-Soo Choi, Asan-si (KR); Min Kim, Cheonan-si (KR); Tae-Ho Moon, Cheonan-si (KR); Ju-Young Yu, Cheonan-si (KR); Sung-Bok Hong, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/089,366

(22) Filed: Nov. 25, 2013

(65) Prior Publication Data

US 2014/0151437 A1 Jun. 5, 2014

(30) Foreign Application Priority Data

Nov. 30, 2012 (KR) .................. 10-2012-0137599

(51) Int. Cl.
*B23K 37/00* (2006.01)
*B23K 31/02* (2006.01)
*H01L 23/00* (2006.01)

(52) U.S. Cl.
CPC ............... *H01L 24/75* (2013.01); *H01L 24/81* (2013.01); *H01L 2224/757* (2013.01); *H01L 2221/68381* (2013.01); *H01L 2224/16225* (2013.01); *H01L 2924/14* (2013.01); *H01L 2224/759* (2013.01); *H01L 2224/81815* (2013.01); *H01L 24/13* (2013.01); *H01L 2224/131* (2013.01); *H01L 2224/81024* (2013.01); *H01L 24/16* (2013.01)

USPC .................. 228/8; 228/33; 228/37; 228/56.2

(58) Field of Classification Search
None
See application file for complete search history.

(56) References Cited

U.S. PATENT DOCUMENTS

| | | | | |
|---|---|---|---|---|
| 3,934,781 A | * | 1/1976 | Klauke et al. | 228/37 |
| 4,398,554 A | * | 8/1983 | Kondo | 137/91 |
| 4,403,949 A | * | 9/1983 | March et al. | 432/29 |
| 4,632,291 A | * | 12/1986 | Rahn et al. | 228/9 |
| 4,698,774 A | * | 10/1987 | Abe et al. | 700/212 |
| 4,792,078 A | * | 12/1988 | Takahashi | 228/8 |
| 4,821,569 A | * | 4/1989 | Soltz | 73/290 V |
| 4,869,418 A | * | 9/1989 | Simpson et al. | 228/37 |
| 5,048,549 A | * | 9/1991 | Hethcoat | 134/122 R |
| 5,179,282 A | * | 1/1993 | Modinger | 250/343 |
| 5,289,966 A | * | 3/1994 | Izumi et al. | 228/180.21 |

(Continued)

FOREIGN PATENT DOCUMENTS

DE 102007062443 A1 * 6/2009
JP 10-206213 8/1998

(Continued)

*Primary Examiner* — Kiley Stoner
(74) *Attorney, Agent, or Firm* — Onello & Mello, LLP

(57) ABSTRACT

A chip mounting apparatus includes a loading unit, a combining unit and a bonding unit. The loading unit loads a circuit board having contact pads and semiconductor chips having solder balls into the chip mounting apparatus. The combining unit positions the semiconductor chip onto a respective mounting area of the circuit board and combines the solder balls of the semiconductor chip with the contact pads of the circuit board by using flux. The combining unit has a flux coater for coating the solder balls with the flux and a flux controller for automatically supplementing the flux to the flux coater. The bonding unit bonds the solder balls to the respective contact pads by a reflow process.

13 Claims, 9 Drawing Sheets

(56) References Cited

U.S. PATENT DOCUMENTS

| | | | |
|---|---|---|---|
| 5,478,004 A * | 12/1995 | Lee | 228/37 |
| 5,615,828 A * | 4/1997 | Stoops | 228/223 |
| 5,857,367 A * | 1/1999 | Akiyama | 72/42 |
| 6,427,898 B2 * | 8/2002 | Maeda et al. | 228/33 |
| 6,766,938 B2 * | 7/2004 | Cheng et al. | 228/41 |
| 7,353,596 B2 * | 4/2008 | Shida et al. | 29/844 |
| 7,455,209 B2 * | 11/2008 | Bourrieres et al. | 228/41 |
| 7,654,433 B2 * | 2/2010 | Houle et al. | 228/41 |
| 7,690,403 B2 * | 4/2010 | You et al. | 141/83 |
| 8,096,183 B2 | 1/2012 | Knittel et al. | |
| 8,240,541 B2 * | 8/2012 | Lyu | 228/33 |
| 2002/0036223 A1 * | 3/2002 | Saito | 228/37 |
| 2004/0060963 A1 * | 4/2004 | Ludwig et al. | 228/103 |
| 2004/0164131 A1 * | 8/2004 | Watanabe | 228/261 |
| 2005/0045914 A1 * | 3/2005 | Agranat et al. | 257/200 |
| 2007/0084283 A1 | 4/2007 | Carlson et al. | |
| 2008/0145541 A1 * | 6/2008 | Williams et al. | 427/282 |
| 2010/0019018 A1 * | 1/2010 | Baumann et al. | 228/223 |
| 2010/0163606 A1 * | 7/2010 | Sato et al. | 228/223 |
| 2010/0200284 A1 * | 8/2010 | Seki et al. | 174/260 |
| 2010/0301102 A1 * | 12/2010 | Tombs | 228/223 |
| 2011/0024482 A1 * | 2/2011 | Peterson | 228/104 |
| 2011/0278348 A1 * | 11/2011 | Sugihara et al. | 228/33 |
| 2012/0211547 A1 * | 8/2012 | Hsiao et al. | 228/102 |
| 2013/0043297 A1 * | 2/2013 | Andrecheck et al. | 228/223 |
| 2014/0030849 A1 * | 1/2014 | Hwang et al. | 438/108 |

FOREIGN PATENT DOCUMENTS

| | | |
|---|---|---|
| JP | 2000-337946 | 12/2000 |
| JP | 3127712 | 1/2001 |
| JP | 2005-127722 | 5/2005 |
| JP | 3860313 | 12/2006 |
| JP | 2009-109277 | 5/2009 |
| JP | 2010-091455 | 4/2010 |
| KR | 2000-0041614 | 7/2000 |
| KR | 10-2001-0063248 | 7/2001 |
| KR | 10-2001-0097238 | 11/2001 |
| KR | 10-0832237 | 5/2008 |
| KR | 10-0855900 | 8/2008 |

* cited by examiner

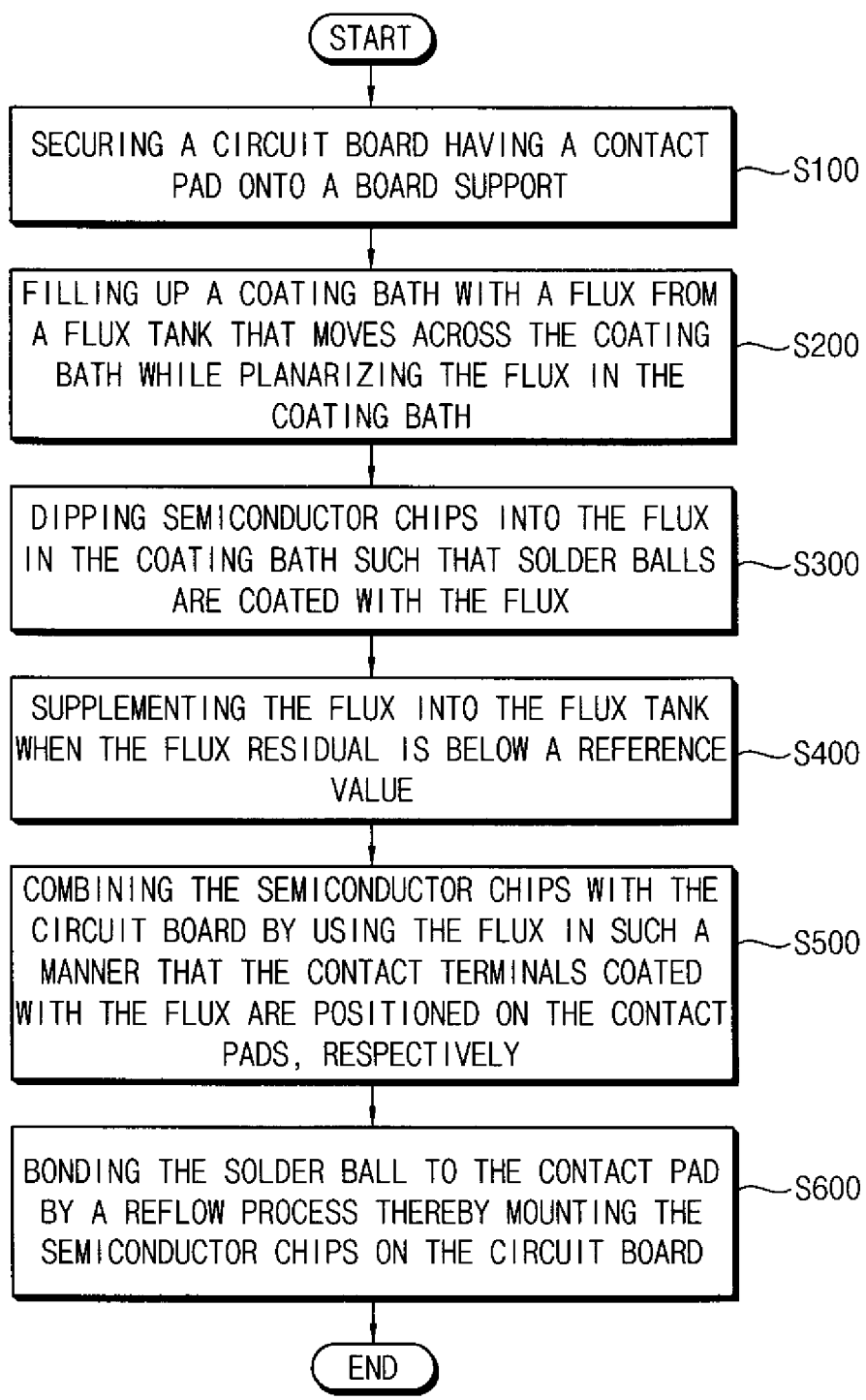

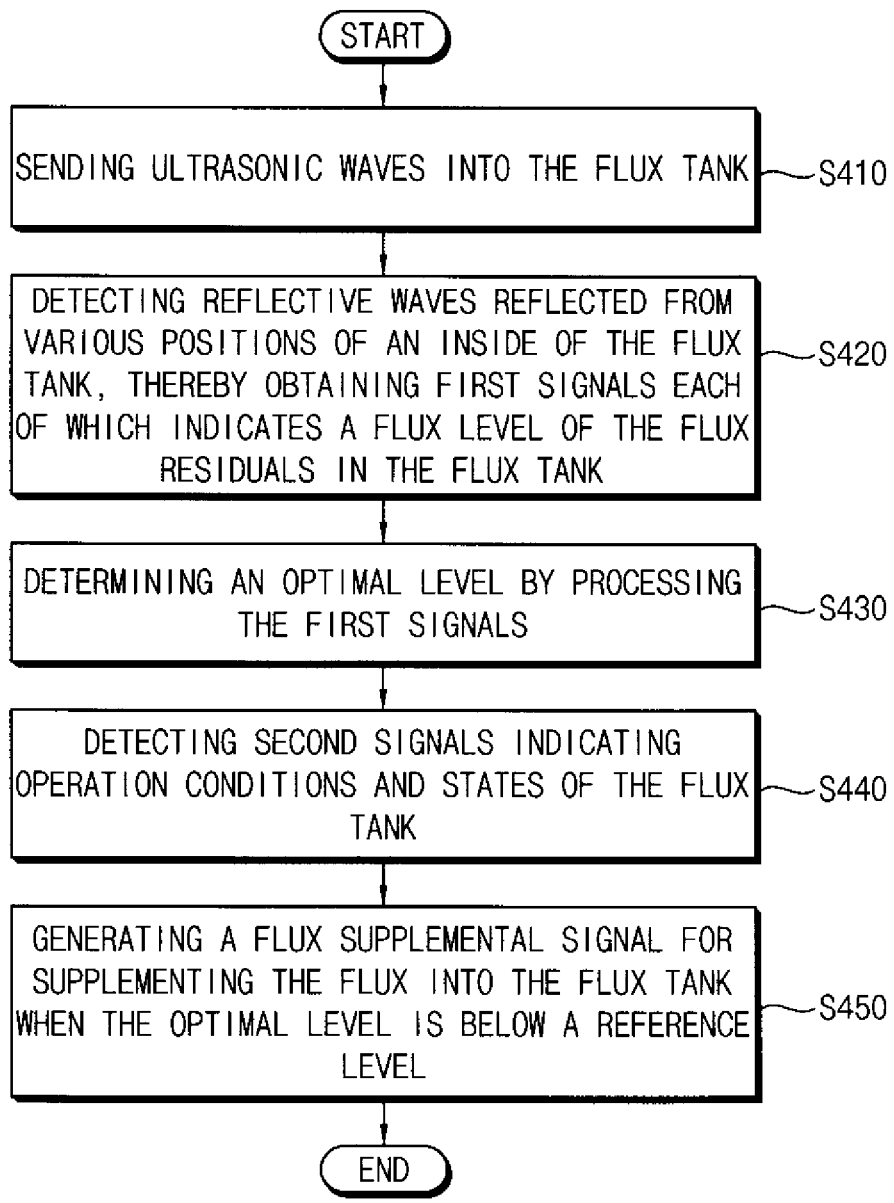

APPARATUS FOR MOUNTING SEMICONDUCTOR CHIPS ON A CIRCUIT BOARD

CROSS-REFERENCE TO RELATED APPLICATIONS

This U.S. non-provisional patent application claims priority under 35 U.S.C. §119 to Korean Patent Application No. 10-2012-0137599, filed on Nov. 30, 2012 in the Korean Intellectual Property Office, the contents of which are herein incorporated by reference in their entirety.

BACKGROUND

1. Field

Example embodiments of the present inventive concepts relate to an apparatus for mounting semiconductor chips on a circuit board and a method of mounting semiconductor chips on a circuit board using the same. More particularly, example embodiments of the present inventive concepts relate to an apparatus for mounting semiconductor chips on a printed circuit board and a method of mounting semiconductor chips on a printed circuit board (PCB) using the same.

2. Description of the Related Art

Recent electronic devices have been highly integrated with high performance, and, thus, the semiconductor packages are also manufactured to have a small size and a high density. An array-type package such as a chip scaled package (CSP) and a flip chip package have been widely used for reducing the size of the semiconductor package, rather than using a peripheral-type package.

In the array type-package, semiconductor chips are usually interconnected to a circuit board in a matrix-like array shape by using a ball grid array (BGA) and bump structures. In the peripheral-type package, the semiconductor chips are interconnected to a circuit board along four lateral sides by using a lead frame or a wire bonding. Thus, the array type package has many advantages. Specifically, the array-type package provides a larger number of input/output pins and the circuit board in the array-type package can be sufficiently downsized in comparison with the peripheral-type package. Thus the mounting density of the array-type package can be much higher than that of the peripheral-type package.

A conventional flip chip package usually includes a plurality of solder bumps arranged on active faces of the semiconductor chips and the solder bumps and the circuit board are bonded to each other. For example, a flux is coated on the solder bumps and the semiconductor chips having the solder bumps are arranged on the circuit board in such a way that the solder bumps correspond to contact positions of the circuit board. Then, a reflow process is preformed on the circuit board and the semiconductor chips, thereby bonding the semiconductor chips to the circuit board.

In a flux coater of a conventional chip mounting apparatus, it is difficult to verify flux residuals in a flux tank. When the flux does not sufficiently remain in the flux tank, the solder bump is insufficiently coated with the flux, and, thus, it is difficult to bond the solder bumps to the circuit board in a subsequent reflow process. The insufficient bonding of the solder bumps to the circuit board usually results in failures in the semiconductor package, which, thereby, reduces package reliability of the semiconductor package.

SUMMARY

Example embodiments of the present inventive concepts provide an apparatus for mounting semiconductor chips on a circuit board in which a flux level in a flux tank can be automatically detected by a flux sensor.

Other example embodiments of the present inventive concepts provide a method of mounting semiconductor chips on a circuit board by using the above chip mounting apparatus.

According to an aspect of the present inventive concepts, there is provided an apparatus for mounting semiconductor chips on a circuit board. The chip mounting apparatus may include a loading unit loading at least a circuit board and at least a plurality of semiconductor chips into the apparatus. The circuit board may have an inner circuit pattern and a plurality of contact pads connected to the inner circuit pattern and the semiconductor chip may have a plurality of contact terminals. The apparatus further includes a combining unit positioning the semiconductor chip onto a respective mounting area of the circuit board and combining the contact terminal of the semiconductor chip with the contact pad of the circuit board by using a flux. The combining unit may have a flux coater for coating the contact terminal with the flux and a flux controller for automatically supplementing the flux to the flux coater. The apparatus further includes a bonding unit bonding the contact terminals of the semiconductor chip to the contact pads of the circuit board using a heat treatment.

In an some embodiments, the flux coater may include a body having a coating bath filled up with the flux that is coated on the contact terminal, and a flux tank holding the flux and moving across the coating bath between first and second standby areas of the body while supplying the flux to the coating bath. The flux controller may include a level sensor over the flux tank adjacent to at least one of the first and second standby areas of the body detecting a flux level of flux residuals remaining in the flux tank as a first signal.

In some embodiments, the level sensor may include a detection section generating ultrasonic waves and detecting reflective ultrasonic waves reflected from an inside of the flux tank, a head section controlling the detection section and a guide section protruding from the head section in a direction along which the ultrasonic waves are sent thereby guiding the ultrasonic waves in the flux tank.

In some embodiments, the detection unit may include a piezo-electric resonator for generating the ultrasonic waves.

In some embodiments, the level sensor may include a supplementary plate positioned over the flux tank and at least one supplementary guide section penetrating through the supplementary plate. The supplementary guide section may be connected with the guide section and thus may guide the ultrasonic waves to various areas in the flux tank.

In some embodiments, the flux controller may include a state sensor detecting operation conditions and states of the flux tank as a second signal, a signal analyzer analyzing the first and the second signals to thereby obtain the flux level and state information on the flux tank, and a control signal generator generating control signals for driving the flux tank and for supplementing the flux into the flux tank according to the flux level and the state information.

In some embodiments, the flux level may include an optimal level obtained by analyzing a plurality of the first signals detected from various positions in the flux tank. The control signal for supplementing the flux may be generated when the optimal level may be below a reference level that may be a preset level of the flux in the flux tank. The state information on the flux tank may include at least one of a relative position of the flux tank with respect to the body, a moving velocity of the flux tank across the coating bath between the first and the second standby areas of the body and a size of the flux tank.

In some embodiments, the optimal level may include an arithmetic average of a plurality of the flux levels corresponding to the plurality of the first signals, respectively, except for a minimal flux level and a maximal flux level.

In some embodiments, the combining unit may further include a board support onto which the circuit board may be secured and a chip aligner for aligning the semiconductor chip of which the contact terminals may be coated with the flux in the coating bath onto the mounting areas of the circuit board, respectively, thereby combining the contact terminals of the semiconductor chip with the contact pads of the circuit board by using the flux.

In some embodiments, the combining unit may further include a mapping tool detecting the positions of the mounting areas and the positions of the contact terminals coated with the flux and mapping the mounting areas and the contact terminals one to one.

In some embodiments, the board support may include a board rail connected with the loading unit and the bonding unit and along which the circuit board may move from the loading unit to the bonding unit and a board stopper installed on the board rail for temporarily stopping the circuit board while combining the semiconductor chips with the circuit board.

In some embodiments, the bonding unit may include a bonding transfer transferring the circuit board having the combined semiconductor chips and circuit board and a heater for performing a reflow process on the contact terminal with which the contact pad may be combined by the flux.

According to another aspect of the present inventive concepts, there is provided a method of mounting semiconductor chips onto a circuit board. A circuit board having a plurality of contact pads may be secured onto a board support. A coating bath may be filled up with flux from a flux tank that may move across the coating bath while planarizing the flux in the coating bath. The semiconductor chips may be dipped into the flux in the coating bath such that contact terminals of the semiconductor chips may be sufficiently coated with the flux. The flux may be supplemented into the flux tank when a flux residual in the flux tank is below a preset reference value. The semiconductor chips may be combined with the circuit board by using the flux such that the contact terminals coated with the flux may be positioned on the contact pads, respectively. The contact terminals may be bonded to the contact pads by a reflow process.

In some embodiments, the flux may be supplemented into the flux tank as follows. Ultrasonic waves may be sent into the flux tank and at least a first signal indicating a flux level of the flux residual in the flux tank may be detected by receiving reflective ultrasonic waves reflected from an inside of the flux tank. An optimal level may be determined by processing the first signal. A second signal indicating operation conditions and states of the flux tank may be detected. A flux supplemental signal for supplementing the flux into the flux tank may be generated when the optimal level is below the preset reference level.

In some embodiments, the ultrasonic waves may be sent into various positions of the inside of the flux tank and a plurality of the first signals are detected by receiving reflective ultrasonic waves reflected from positions of the inside of the tank such that each of the first signals may indicate a flux level of the flux residuals at each of the positions of the flux tank, and the optimal level may be determined as an arithmetic average of the plurality of the flux levels corresponding to the respective first signals, except for a minimal flux level and a maximal flux level.

According to another aspect of the present inventive concepts, there is provided an apparatus for mounting semiconductor chips on a circuit board. The apparatus may include a combining unit positioning the semiconductor chip onto a respective mounting area of the circuit board and combining a contact terminal of the semiconductor chip with a contact pad of the circuit board using flux. The combining unit may include a flux coater for coating the contact terminal with the flux and a flux controller for automatically supplementing the flux to the flux coater. The flux coater comprises a flux tank holding the flux. The flux controller comprises a level sensor over the flux tank detecting a flux level of flux residuals in the flux tank such that, when the detected flux level of the flux residuals is below a preset reference level, the flux controller automatically supplements flux into the flux tank.

In some embodiments, the apparatus further includes a bonding unit bonding the contact terminal of the semiconductor chip to the contact pad of the circuit board using a heat treatment.

In some embodiments, the apparatus further includes a loading unit loading the circuit board and the semiconductor chip into the apparatus and providing the circuit board and semiconductor chip to the combining unit and an unloading unit unloading bonded semiconductor chip and circuit board from the bonding unit out of the apparatus.

In some embodiments, the flux coater further comprises a body having a coating bath filled with the flux that is coated on the contact terminal. The flux tank holding the flux moves across the coating bath between first and second standby areas of the body while supplying the flux to the coating bath. The level sensor is adjacent to at least one of the first and second standby areas of the body.

In some embodiments, the level sensor includes a detection section generating ultrasonic waves and detecting reflective ultrasonic waves reflected from an inside of the flux tank, a head section controlling the detection section, and a guide section protruding from the head section in a direction along which the ultrasonic waves are sent thereby guiding the ultrasonic waves in the flux tank.

According to example embodiments of the present inventive concepts, a level of flux residuals in the flux tank may be automatically determined by using a level sensor that may be arranged over the flux tank. When the detected flux level of the flux residuals may be below the preset reference level, the flux may be automatically supplemented into the flux tank. Thus, the flux tank may hold a sufficient flux when moving across the coating bath and the flux may be sufficiently supplied into the coating bath. Accordingly, the solder balls of the semiconductor chip may be prevented from being insufficiently coated with the flux, thereby contact failures between the solder balls and the contact pads caused by the insufficient flux coating on the solder balls may be prevented.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

FIG. 9 is a flow chart illustrating processing steps for a method of mounting semiconductor chips onto a circuit board using the chip mounting apparatus of FIG. 1 in accordance with an example embodiment of the present inventive concepts.

FIG. 10 is a flow chart illustrating processing sub-steps for a step of supplementing flux into a flux tank of FIG. 9 in accordance with an example embodiment of the present inventive concepts.

DETAILED DESCRIPTION OF THE EMBODIMENTS

Figure 1:
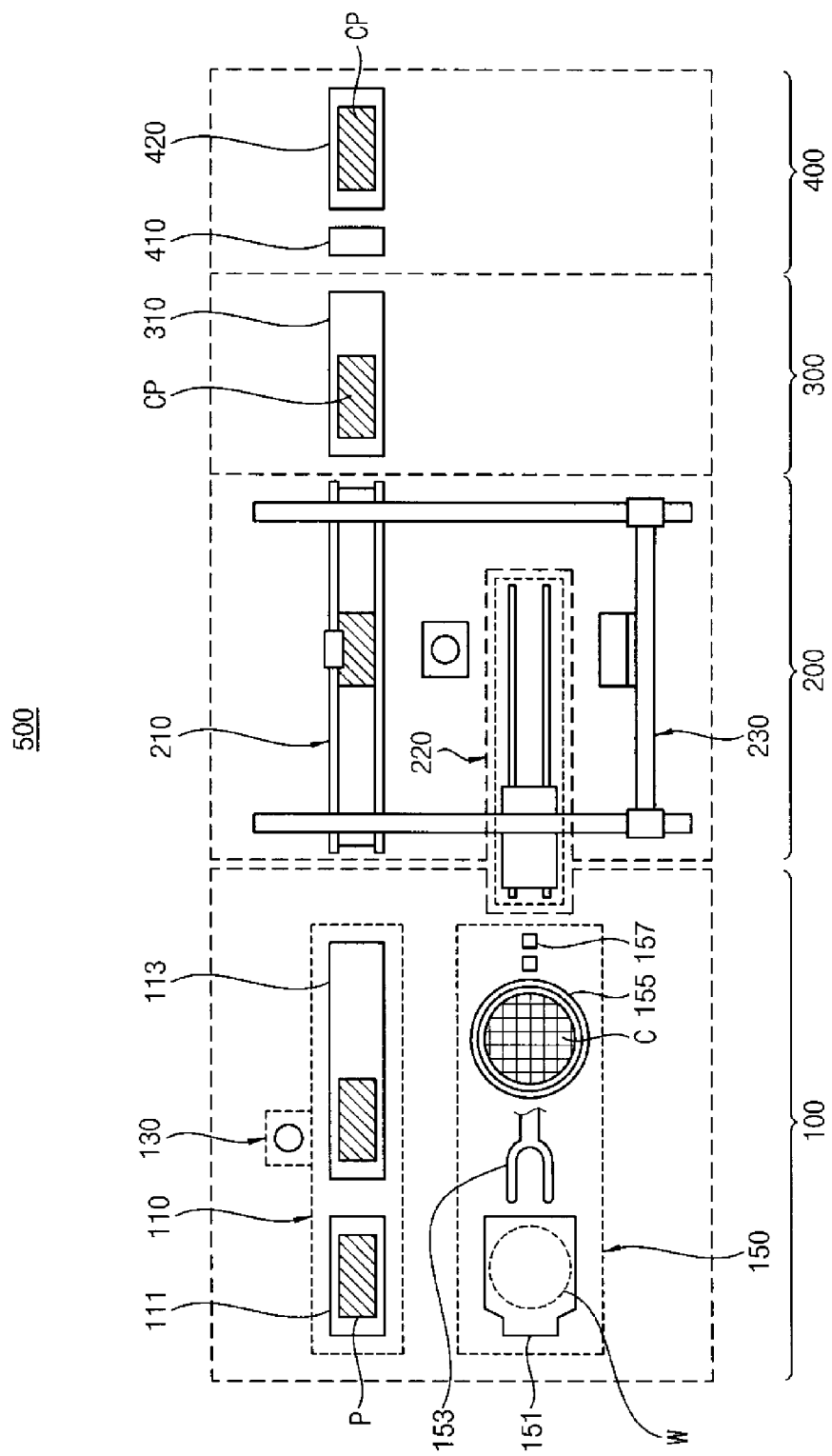
FIG. 1 is a structural view illustrating an apparatus for mounting semiconductor chips on a circuit board in accordance with an example embodiment of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Hereinafter, example embodiments will be explained in detail with reference to the accompanying drawings.

FIG. 1 is a structural view illustrating an apparatus for mounting semiconductor chips on a circuit board 500 in accordance with an example embodiment of the present inventive concepts.

Referring to FIG. 1, the apparatus for mounting semiconductor chips on a circuit board 500 (hereinafter, referred to as chip mounting apparatus 500) in accordance with an example embodiment of the present inventive concepts may include a loading unit 100 for loading at least a circuit board P and at least a semiconductor chip C into the chip mounting apparatus 500, a combining unit 200 for locating and combining the semiconductor chip C onto a respective mounting area A of the circuit board P, a bonding unit 300 for bonding the semiconductor chip C to a contact pad of the mounting area A of the circuit board P to thereby provide a mounted semiconductor chip C on the circuit board P and an unloading unit 400 for unloading the mounted semiconductor chip from the chip mounting apparatus 500.

The loading unit 100, the combining unit 200, the boding unit 300 and the unloading unit 400 may be sequentially operated and may be arranged in such a configuration that the chip mounting apparatus 500 may have a minimal footprint. For example, the loading unit 100, the combining unit 200, the bonding unit 300 and the unloading unit 400 may be arranged in a line and may be connected with neighboring units through a conveyor system. The semiconductor chips C and the circuit board P may be individually loaded into the chip mounting apparatus 500 by the loading unit 100 and may be sequentially processed in the chip mounting apparatus 500. Thus, a semiconductor package in which the semiconductor chips C may be combined with the circuit board P may be manufactured in the combining unit 200 and the bonding unit 300. Thereafter, the semiconductor package may be unloaded from the chip mounting apparatus 500 by the unloading unit 400.

For example, the loading unit 100 may include a board provider 110 for loading the circuit board P into the chip mounting apparatus 500 and a chip provider 150 for loading the semiconductor chip C into the chip mounting apparatus 500. In the present example embodiment, the circuit board P may include a printed circuit board (PCB) having an inner circuit pattern and a plurality of contact pads. In the present example embodiments, the semiconductor chip C may include a flip chip in which a plurality of contact terminals, for example, solder bumps or solder balls, may be arranged on an active face of an integrated circuit chip. However, the present inventive concept is not limited thereto; any other circuit boards and semiconductor chips may be loaded into the chip mounting apparatus 500, as would be known to one of the ordinary skill in the art.

The board provider 110 may include a first board carrier 111 for carrying the circuit board P and a board transfer 113 for transferring the circuit board P to the combining unit 200. For example, the first board carrier 111 may include a magazine shaped into a cube of which the front and the rear portions may be open. A plurality of slots may be arranged on inner side surfaces of the magazine, and the circuit boards P may be received at each slot, respectively, in the magazine. Thus, a plurality of the circuit boards P may be simultaneously carried to the chip mounting apparatus 500 by the magazine. A pusher (not illustrated) may be provided at a rear portion of the magazine and the circuit board P received at each slot of the magazine may be pushed forward. Thus, the circuit board P may be individually pushed out of the magazine into the board transfer 113 adjacent to the magazine. The board transfer 113 may include a conveyer belt that may be extended to the combining unit 200. Thus, the circuit board P may be transferred from the first board carrier 111 to the combining unit 200 through the board transfer 113, for example, along a conveyer belt.

The circuit board P may include a printed circuit board (PCB) having an electrical circuit pattern for transmitting electrical signals. A plurality of mounting areas may be arranged on a surface of the PCB in a matrix shape. A plurality of contact pads may be arranged at each of the mounting areas and the solder bumps of the semiconductor chip may be bonded to the contact pads, respectively. In the present example embodiment, a board detector 130 may be arranged over the board transfer 113 and may detect any defects in each mounting area of the circuit board P.

The chip provider 150 may include a wafer carrier 151 for carrying a plurality of wafers W having a plurality of semiconductor chips and a wafer extractor 153 for individually extracting the wafer W from the wafer carrier 151. The chip provider 150 may include a wafer support 155 to which the extracted wafer W may be secured and which supports the wafer W. The chip provider 150 may include a chip transfer 157 which individually picks up the semiconductor chip C from the wafer W and transfers the semiconductor chip C to a flux coater of the combining unit 200.

The wafer carrier 151 may include a wafer cassette in which a plurality of slots may be arranged on inner surfaces and a plurality of the wafers W may be received at the slots, respectively. A chip fabrication process, a back grinding process and a sawing process may have been performed on the wafer W, and, thus, the semiconductor chips on the wafer W may be separated from one another individually. For example, a ultraviolet (UV)-ray tape may be provided on a rear surface of the wafer W and a wafer ring (not illustrated) may be inserted along a peripheral portion of the wafer W, and, thus, a plurality of the semiconductor chips may be tied to one another by the UV-ray tape on the wafer W. Therefore, a group of the semiconductor chips C may be loaded to the chip mounting apparatus 500 by a unit of a wafer. As a result, the semiconductor chips C may be loaded into the chip mounting apparatus 500 by the wafer carrier 151 such as a conventional wafer cassette. The wafer W received on the wafer carrier 151 may be individually extracted by the wafer extractor 153, which is, for example, a robot arm, and may be secured onto the wafer support 155.

A UV-ray illuminator (not illustrated) may be arranged below the wafer support 155 and, thus, UV rays may be illuminated onto a rear surface of the wafer W that may be secured onto the wafer support 155, thereby weakening the adhesion of the UV-ray tape with respect to the wafer W. Thus, the semiconductor chips C on the wafer W may be untied from one another. An expander (not illustrated) may be further provided over the wafer support 155 and, thus, the weakened UV-ray tape may be expanded outwards from the wafer W, to thereby facilitate picking up the semiconductor chip C from the wafer W.

The chip transfer 157 may individually pick up the semiconductor chip C from the wafer W on the wafer support 155 and may transfer the semiconductor chip C to a flux coater 220 of the combining unit 200. For example, the chip transfer 157 may extract the individual semiconductor chip C out of the wafer W using a vacuum pump and may transfer the extracted semiconductor chip C in such a way that the contact terminals, for example, solder bump or solder balls, of the semiconductor chip C may be dipped into a flux reservoir of the flux coater 220.

Accordingly, the circuit board P and the semiconductor chip C may be individually loaded into the combining unit 200 by the loading unit 100. Specifically, the circuit board P is loaded into the combining unit 200 by the board transfer 113 and the semiconductor chip C is loaded into the combining unit 200 by the chip transfer 157. While the present example embodiment discloses that the loading unit 100 may include a single board provider 110 and a single chip provider 150, a plurality of board providers 110 and a plurality of chip providers 150 may also be provided in the loading unit 100, as long as the footprint and process efficiency of the chip mounting apparatus 500 may not be deteriorated.

Figure 2:
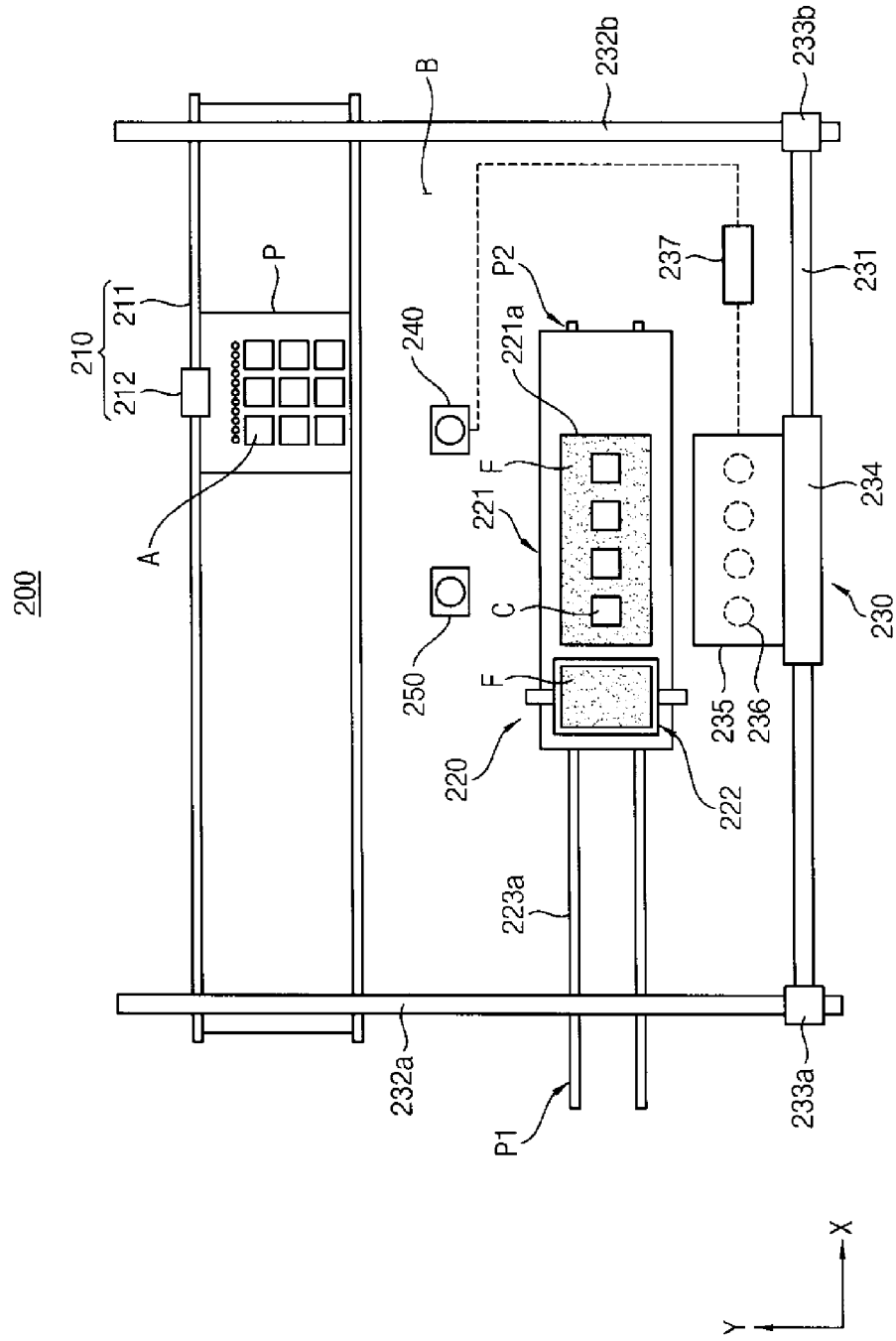
FIG. 2 is a structural view illustrating a combining unit of the chip mounting apparatus of FIG. 1 in accordance with an example embodiment of the present inventive concepts.
Figure 3:
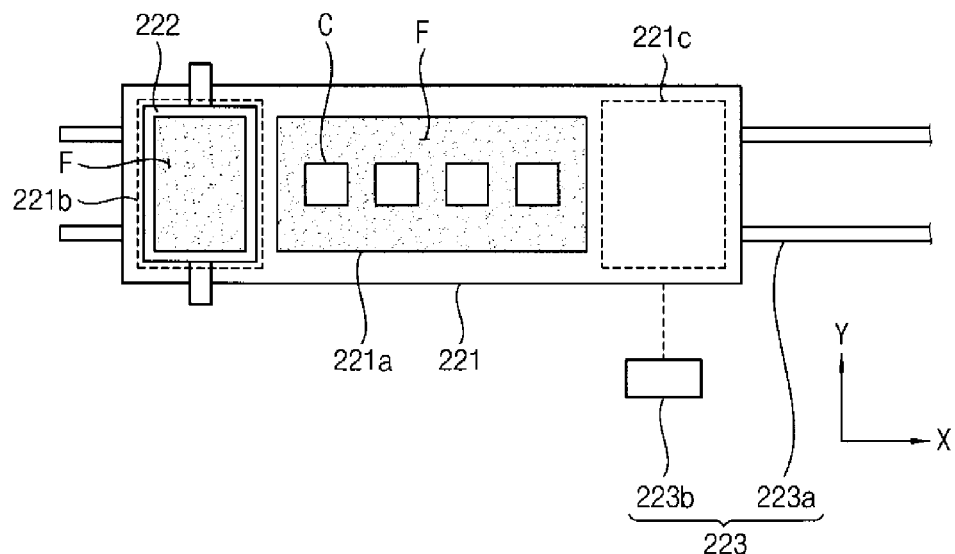
FIG. 3 is a structural view illustrating a flux coater of the combining unit of in FIG. 2 in accordance with an example embodiment of the present inventive concepts.

FIG. 2 is a structural view illustrating the combining unit 200 of the chip mounting apparatus 500 of FIG. 1 and FIG. 3 is a structural view illustrating a flux coater 220 of the combining unit 200 of FIG. 2 in accordance with an example embodiment of the present inventive concepts.

Referring to FIGS. 1, 2 and 3, the combining unit 200 may include a board support 210 connected to the board transfer 113 and the circuit board P is secured to the board support 210. The combining unit 200 may include the flux coater 220 which coats a flux on the solder bumps of the semiconductor chip C that may be transferred by the chip transfer 157 to the flux coater 220. The combining unit 200 may include a chip aligner 230 for aligning the semiconductor chip C, on which the solder bumps may be coated with the flux, with the circuit board P corresponding to the mounting areas A of the circuit board P. The combining unit 200 may include a mapping tool 240 for assuring the coincidence of the mounting area A of the circuit board P and the semiconductor chip C. The combining unit 200 may include a flux controller 250 which detects the flux residuals of the flux coater 220 and controls the flux coater 220.

The circuit board P may be transferred to the board support 210 from the board transfer 113 and may be secured thereto. The semiconductor chip C may be transferred to the flux coater 220 by the chip transfer 157. The chip aligner 230 may transfer the semiconductor chip to the flux coater 220. The semiconductor chip C may then be transferred onto the circuit board P and may be aligned with the mounting area A of the circuit board P by the chip aligner 230. When completing the alignment of the semiconductor chip C with the mounting area A of the circuit board P and the arrangement of the semiconductor chip C on the circuit board P, the circuit board P on which the semiconductor chips may be arranged may be transferred to the neighboring bonding unit 300. For example, the board support 210 may include a board rail 211 which extends in a first direction X, that is, a horizontal direction, and connects with the board transfer 113 and the bonding unit 300, a support plate (not illustrated) on which the circuit board P may be positioned and a board stopper 212 which is installed on the board rail 211 and couples to the support plate. The board stopper 212 may stop the circuit board P moving along the board rail 211 for a time when the semiconductor chips C may be located or positioned on the circuit board P. When completing the positioning of the semiconductor chips C on the circuit board P, the circuit board P may again move along the board rail 211 to the bonding unit 300.

For example, the board stopper 212 may include a gripper (not illustrated) for gripping onto the board rail 211 and the board stopper 212 may move along the board rail 211 at a constant speed. Thus, when the board stopper 212 may sufficiently grip on the board rail, the circuit board P may be stopped and the semiconductor chips C may be positioned on the circuit board P.

The chip aligner 230 may be arranged over the board support 210 and the flux coater 220, and may include a horizontal guide rail 231 extending in the first direction X, a pair of vertical guide rails 232a and 232b extending in a second direction Y, that is, the vertical direction. The vertical guide rails 232a and 232b intersect with the horizontal guide rail 231 at first and second end portions of the horizontal guide rail 231, respectively. A pair of first drivers 233a and 233b may be provided with the chip aligner 230 in such a configuration that the first drivers 233a and 233b may be connected at both of the first and second end portions of the horizontal guide rail 231 and may move along the vertical guide rails 232a and 232b, respectively. A second driver 234 may be installed on the horizontal guide rail 231 and move along the horizontal guide rail 231 in the first direction X. A holding bracket 235 may be secured to the second driver 234 and at least a chip picker 236 may be provided with the holding bracket 235.

The horizontal guide rail 231 may extend in the first direction X and the vertical guide rails 232a and 232b may extend in the second direction Y, which is substantially perpendicular to the first direction X, while intersecting with both of the first and second end portions of the horizontal guide rail 231, respectively, so that the horizontal guide rail 231 and the vertical guide rails 232a and 232b may define a rectangular operation area B covering the board support 210 and the flux coater 220. That is, the board support 210 and the flux coater 220 may be positioned in the operation area B and the horizontal and the vertical guide rails 231, 232a and 232b may be positioned over the board support 210 and the flux coater 220. The first and second end portions of the horizontal guide rail 231 may be connected to the first drivers 233a and 233b, respectively, and may move along the respective vertical guide rails 232a and 232b. Therefore, the horizontal guide rail 231 extending in the first direction X may be moved along the vertical guide rails 232a and 232b in the second direction Y, that, is the vertical direction, by the first drivers 233a and 233b. The second driver 234 may move along the horizontal guide rail 231 in the first direction X, that is, the horizontal direction, and, thus, the holding bracket 235 may also move along the first direction X.

Therefore, the holding bracket 235 may be moved along the horizontal guide rail 231 in the first direction X by the second driver 234 while being moved along the vertical guide rails 232a and 232b in the second direction Y by the first drivers 233a and 233b. Thus, the holding bracket 235 may be uniquely positioned in the rectangular operation area B by a Cartesian coordinate system defined by the first and the second directions X and Y.

The chip picker 236 may be secured to the holding bracket 235 and may be arranged to face the underlying board support 210 and the flux coater 220. For example, the chip picker 236 may include an absorption rod for extracting and holding the semiconductor chips C using a vacuum pressure.

When the position of the flux coater 220 and the board support 210 may be fixed in the operation area B by the Cartesian coordinate system defined by the first and the second directions X and Y, the holding bracket 235 may be moved accurately over the flux coater 220 by the first and the second drivers 233a, 233b, and 234. The semiconductor chip C may be flux coated by the flux coater 220. That is, the semiconductor chip C may be dipped into the flux to coat the semiconductor chip C in flux F. Then, the flux-coated semiconductor chip C may be picked up by the chip picker 236. The semiconductor chip C may be picked up by the chip picker 236 and held onto the holding bracket 235 using the vacuum pressure and the holding bracket 235 may be moved accurately over the board support 210 in such a way that the semiconductor chip C may be aligned with the mounting area A of the circuit board P. Then, the holding bracket 235, to which the chip picker 236 may be secured, may be moved accurately over the board support 210 and the semiconductor chip C may be released from the chip picker 236 onto the corresponding mounting area A of the circuit board P. Thus, the semiconductor chip C may be temporarily combined with, or arranged on, the corresponding mounting area A. In the present example embodiment, a plurality of the semiconductor chips C may be simultaneously picked up by the chip picker 236 and a plurality of the semiconductor chips C may be simultaneously aligned with the mounting areas A and temporarily combined with the corresponding mounting areas A.

Solder bumps of the semiconductor chip C, which may be transferred by the chip transfer 157, may be coated with the flux F by the flux coater 220. The flux F may increase the adhesion force between the solder bump and the contact pad of the circuit board P.

For example, the flux coater 220 may include a body 221 having a coating bath 221a filled up with the flux F that may be coated on a surface of the solder balls of the semiconductor chip C, a flux tank 222 positioned at a side of the body 211 and holding the flux F that may be supplied to the flux bath 221a and a body driver 223 for driving the body 221.

For example, the body 221 may have a rectangle shape extending along the first direction X. A central portion of the body 221 may be recessed to a depth to thereby provide the coating bath 221a. The coating bath 221a may be filled up with the flux F in such a way that an upper surface of the flux F may be coplanar with an upper surface of the body 221. A plurality of the semiconductor chips C may be dipped into the flux F of the coating bath 221*a* and, thus, the solder balls of the semiconductor chips C may be coated with the flux F.

First and second standby areas 221*b* and 221*c* may be provided at both end portions of the body 221 at which the flux tank 222 may be positioned. That is, the upper surface portions of the body 221 opposite to each other with respect to the coating bath 221*a* along the first direction X may be provided as standby areas for the flux tank 222. The flux tank 222 may move linearly back and fourth along the first direction X across the coating bath 221*a* from the first standby area 221*b* to the second standby area 221*c* or vice versa. The flux tank 222 may be driven by a tank driver (not illustrated) such as a belt pulley below the body 221.

Figure 4:
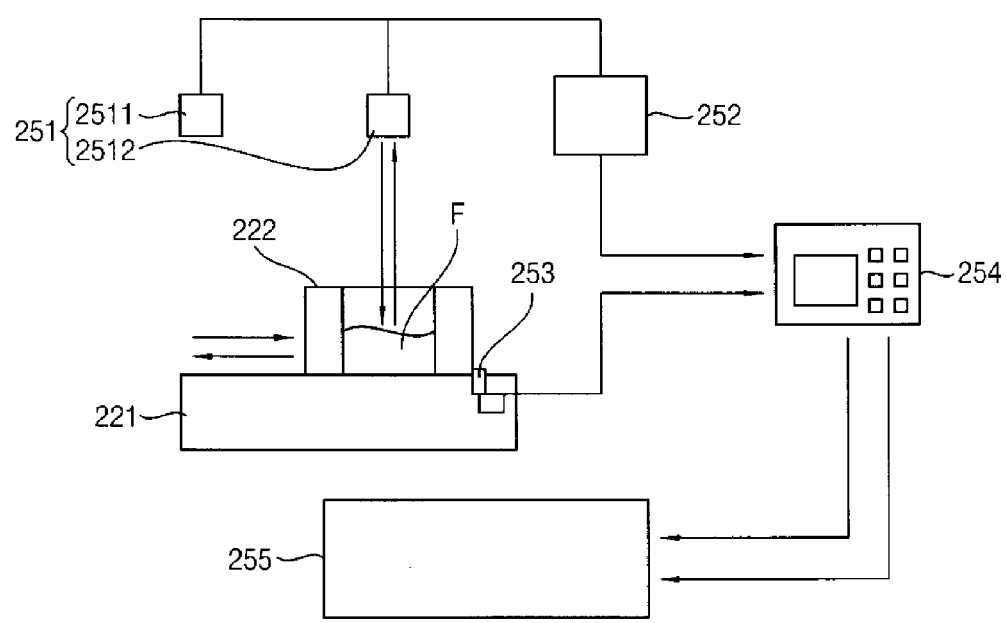
FIG. 4 is a structural view illustrating the flux controller of FIG. 2 in accordance with an example embodiment of the present inventive concepts.

The flux tank 222 may have a cubed shape and an upper portion of the flux tank 222 may be open. A predetermined amount of the flux may be received in the flux tank 222 and may be supplied to the coating bath 221*a* through a flux outlet (not illustrated) at a bottom thereof. A level sensor 251, as illustrated in FIG. 4, may be provided with the flux tank 222 and an upper surface of the flux F in the flux tank 222 may be detected by the lever sensor 251. When the flux tank 222 is standing by at the first or the second standby area 221*b* or 221*c*, the semiconductor chip C having bare solder balls may be transferred to the coating bath 221*a* by the chip transfer 157 and the semiconductor chip C having the solder balls sufficiently coated with the flux F may be transferred onto the circuit board P by the chip picker 236. The flux F may be supplied to the coating bath 221*a* through the flux outlet of the flux tank 222, while the flux tank 222 moves across the coating bath 221*a* between the first and the second standby areas 221*b* and 221*c*. Particularly, a planarization member (not illustrated) may be further provided at a rear portion of the flux tank 222 and, thus, the flux F in the coating bath 221*a* under the flux tank 222 may be planarized by moving the flux tank 222 across the coating bath 221*a*. Thus, the upper surface of the flux F in the coating bath 221*a* may be coplanar with the upper surface of the body 221. For example, an even member (not illustrated) may be provided at a side of the rear portion of the flux tank 222 as the planarization member.

A level sensor 251 may detect a level of the flux F that remains in the flux tank 222 when the flux tank 222 is positioned at the first or the second standby area 221*b* or 221*c*. In a case in which the detected level of the flux F is below a preset reference value, the flux F may be filled into the flux tank 222. That is, the flux F is automatically supplemented into the flux tank 222 when the when the level of the flux F is below a preset reference value.

The body 221 to which the flux tank 222 may be installed may be moved along the first direction X by the body driver 223. For example, the body driver 223 may include a driving rail 223*a* extending in the first direction X and a driving member 223*b* for driving the body 221 along the driving rail 223*a*. Thus, the body 221 may be moved back and forth along the driving rail 223*a* by the body driver 223 between a first position P1 adjacent to the chip transfer 157 and a second position P2 adjacent to the board support 210, as illustrated in FIG. 2. When the body 221 is positioned at the first position P1, the semiconductor chips C may be transferred to the coating bath 221*a* of the body 221 by the chip provider 150. In contrast, when the body 221 is positioned at the second position P2, the semiconductor chips C of which the solder balls may be sufficiently coated with the flux F may be transferred to the circuit board P that is secured to the board support 210.

The mapping tool 240 and the flux controller 250 may be arranged at a side of the flux coater 200. The mapping tool 240 detects the positions of the mounting area A of the circuit board P and the semiconductor chip C that may be positioned on each of the mounting areas A. The flux controller 250 may detect the residuals of the flux F in the flux tank 222 and may supplement the flux tank 222 with the flux F when the residuals of the flux F are insufficient.

The mapping tool 240 may be positioned between the board rail 211 and the second position P2. Thus, the mapping tool 240 detects the positions of the mounting areas A of the circuit board P and the positions of the solder balls of the semiconductor chips C that are picked up from the coating bath 221*a* by the chip picker 236. The flux-coated semiconductor chips C may be arranged on the circuit board P in such a way that the solder balls may be aligned with the mounting areas A of the circuit board P, respectively, according to the position information of the mapping tool 240. The mapping tool 240 and the chip picker 236 may be connected to an aligning controller 237, and, thus, the positions of the semiconductor chips C picked up by the chip picker 236 may be transferred to the mapping tool 240 by the alignment controller 237.

When the solder balls are sufficiently coated with flux F in the coating bath 221*a* and the semiconductor chips C are picked up from the coating bath 221*a* by the chip picker 236, a chip selection signal may be transferred to the mapping tool 240. Then, the mapping tool 240 may detect the positions of the solder balls and match the detected positions of the solder balls with the detected positions of the mounting areas A. The information of the corresponding positions of the solder balls and the mounting areas A may be transferred again to the aligning controller 237 by the mapping tool 240. The chip picker 236 may be controlled in such a way that a solder ball may be aligned with a corresponding mounting area A of the circuit board P. Thus, the solder ball of the semiconductor chip C may be positioned on the contact pad of the corresponding mounting area A of the circuit board P.

The flux controller 250 may detect the level of the flux F in the flux tank 222 and may determine the amount of the flux residuals of the flux tank 222. When the amount of the flux residuals is below a preset reference amount, the flux F may be supplemented into the flux tank 222. In addition, the flux controller 250 may also control the movement of the flux coater 220.

FIG. 4 is a structural view illustrating the flux controller 250 of FIG. 2 in accordance with an example embodiment of the present inventive concepts.

Referring to FIG. 4, the flux controller 250 may include a level sensor 251 detecting a first signal that may indicate the level of the flux residuals in the flux tank 222, an amplifier 252 amplifying the first signal, a state sensor 253 detecting a second signal that may indicate operation conditions and states of the flux tank 222, a signal analyzer 254 analyzing the first and the second signals to thereby obtain the flux level and state information of the flux tank 222, and a control signal generator 255 generating control signals for driving the flux tank 222 and for supplementing the flux into the flux tank 222.

For example, the level sensor 251 may include first and second ultrasonic sensors 2511 and 2512 that may be secured to first and second columns (not illustrated), respectively. The first column may be positioned adjacent to the first standby area 221*b* and the second column may be positioned adjacent to the second standby area 221*c*. The first and second ultrasonic sensors 2511 and 2512 may be positioned over the flux tank 222 in the first and second standby areas 221*b* and 221*c*, respectively. The first ultrasonic sensor 2511 may send ultrasonic waves into the flux tank 222 when the flux tank 222 is positioned at the first standby area 221b and may detect reflective waves that may be reflected from an upper surface of the flux in the flux tank 222. Thus, the level of the flux in the flux tank 222 may be detected at the first standby area 221b by the first ultrasonic sensor 2511, thereby determining the amount of the flux residuals of the flux tank 222 at the first standby area 221b. In the same way, the second ultrasonic sensor 2512 may send ultrasonic waves into the flux tank 222 when the flux tank is positioned in the second standby area 221c and may detect reflective waves that may be reflected from an upper surface of the flux in the flux tank 222. Thus, the level of the flux in the flux tank 222 may be detected at the second standby area 221c by the second ultrasonic sensor 2512, thereby determining the amount of the flux residuals of the flux tank 222 at the second standby area 221c.

Figure 5:
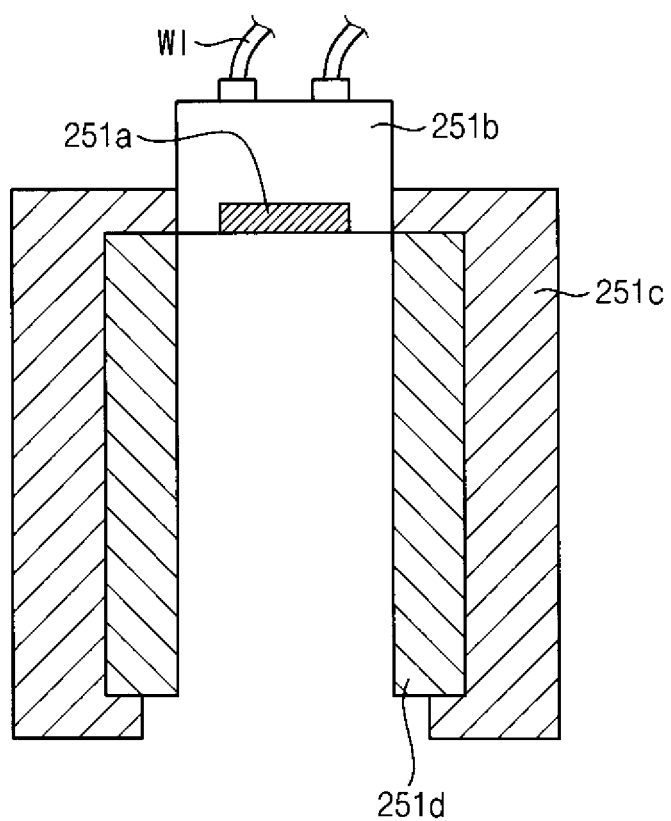
FIG. 5 is a schematic view illustrating a level sensor of FIG. 4 in accordance with an example embodiment of the present inventive concepts.

FIG. 5 is a schematic view illustrating the level sensor 251 of FIG. 4 in accordance with an example embodiment of the present inventive concepts.

Referring to FIG. 5, the level sensor 251 may include a detection section 251a generating the ultrasonic waves and detecting the reflective waves from the flux F, a head section 251b receiving various signals for controlling the detection section 251a from the control signal generator 255 and a guide section 251c protruding from the head section 251b in a direction along which the ultrasonic waves may be sent to thereby guide the ultrasonic waves in the flux tank 222.

For example, the detection section 251a may include a piezo-electric resonator for generating the ultrasonic waves and sending the ultrasonic waves onto the upper surface of the flux F and a wave receiver for receiving the reflective waves from the upper surface of the flux F, to thereby determine the level of the flux F from the reflective waves. The piezo-electric resonator and wave receiver may be prepared in a single body that may be installed on the head section 251b. Otherwise, the piezo-electric resonator and wave receiver may be individually installed on the head section 251b, respectively. Particularly, in a case in which the piezo-electric resonator and wave receiver are individually installed on the level sensor 251, the wave receiver may be installed on any other members in place of the head section 251b. That is, the piezo-electric resonator may be installed on the head section 251b that may be connected to the control signal generator 255 and the wave receiver may be installed on other members regardless of the control signal generator 255.

The head section 251b may include the detection section 251a therein and may be electrically connected to the control signal generator 255. According to a wave generation signal transferred from the control signal generator 255, the head section 251b may operate the piezo-electric resonator and send the ultrasonic waves into the flux tank 222. Then, the head section 251b may operate the wave receiver to detect the reflective waves from the upper surface of the flux F and, then, may transfer the reflective waves to the amplifier 252. In addition, the head section 251b may also vary the position of the piezo-electric resonator and, as a result, may vary the path of the ultrasonic waves. The configuration of the guide section 251c may also be varied according to the path of the ultrasonic waves because the guide section 251c may be optimized for efficiently guiding the ultrasonic waves into the flux tank 222. The variation of the position of the piezo-electric resonator, the path of the ultrasonic waves and the configuration of the guide section 251c may facilitate the detection of the flux level at any point in the flux tank 222. Various wirings WI may be prepared at an upper portion of the head section 251b and, thus, the head section 251b may be electrically connected to the amplifier 252, the signal analyzer 254 and the control signal generator 255.

The guide section 251c may be shaped into a cylinder extending downwards from the head section 251b in the direction along which the ultrasonic waves may be sent into the flux tank 222, and, thus, the guide section 251c may guide the ultrasonic waves into the flux tank 222. That is, the ultrasonic waves may be focused onto the flux F in the flux tank 222 by the guide section 251c. In addition, the reflective waves reflected from the upper surface of the flux F may be efficiently received by the wave receiver of the guide section 251c, to thereby increase the detection efficiency of the wave receiver. For example, the guide section 251c may comprise a relatively hard resin or a metal having sufficient reflectivity, so that the reflective waves may be efficiently detected by the wave receiver. In the present example embodiment, a porous member 251d may be further installed on an inner surface of the cylindrical guide section 251c. When the flux F is spotted on the inner surface of the guide section 251c, the reflective waves may be hindered from being received at the wave receiver. The porous member 251d may prevent the spotting of the flux F onto the inner surface of the cylindrical guide section 251c, thereby improving the efficiency of the reflective wave detection.

Figure 6:
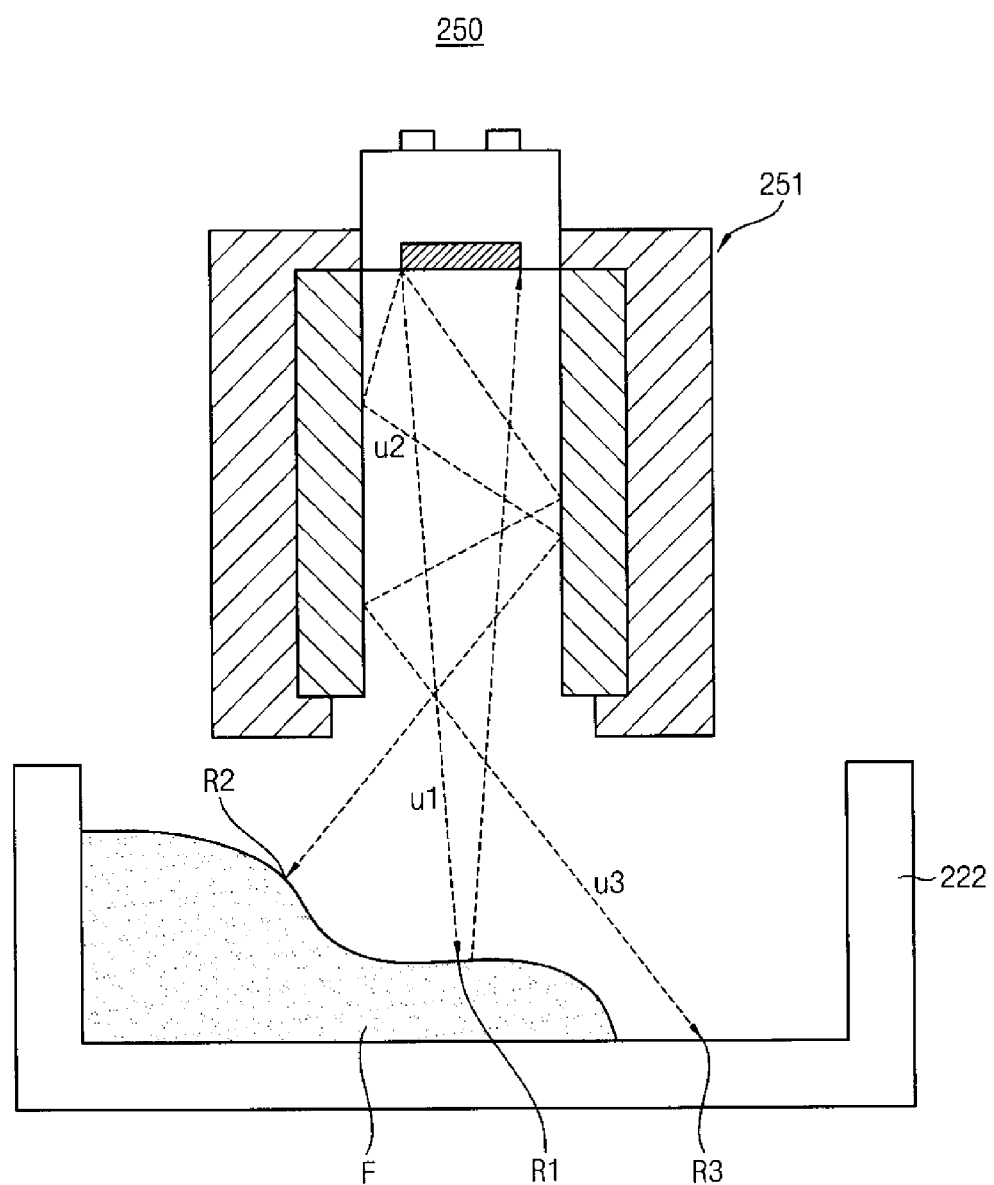
FIG. 6 is a view illustrating detection of a reflective wave using the level sensor of FIG. 5 in accordance with an example embodiment of the present inventive concepts.

FIG. 6 is a view illustrating the detection of the reflective wave using the level sensor 251 of FIG. 5 in accordance with an example embodiment of the present inventive concepts.

Referring to FIG. 6, the ultrasonic waves may be generated from the piezo-electric resonator and may be sent into the flux tank 222. Then, the ultrasonic waves may be reflected from the upper surface of the flux F and may be detected by the wave receiver. The flux level may be induced from the time interval between the time in which the ultrasonic waves are sent and the time in which the reflective waves are detected and the gap distance between the detection section 251a and the upper surface of the flux F.

The ultrasonic waves may reach the upper surface of the flux F through various paths. For example, a first ultrasonic wave u1 may be sent from the piezo-electric resonator, may directly reach the upper surface of the flux F from the piezo-electric resonator and may be reflected from the upper surface of the flux F at a first reflection position R1. In addition, for example, a second ultrasonic wave u2 may be reflected from a first inner surface of the guide section 251c to a second inner section of the guide section 251c onto the upper surface of the flux F and, thus, may be reflected from the upper surface of the flux F at a second reflection position R2. In addition, for example, a third ultrasonic wave u3 may also be reflected from the second inner surface of the guide section 251c to the first inner section of the guide section 251c onto the upper surface of the flux F, and, thus, may be reflected from a bottom surface of the flux tank 222 at a third reflection position R3. The ultrasonic waves are not limited to the described ultrasonic waves.

The flux F may include a viscous fluid and, thus, a larger amount of the flux F may be distributed at a front portion of the flux tank 222 and a smaller amount of the flux F may remain at a rear portion of the flux tank 222 due to the movement the flux tank 222 along the body 221. The term 'front portion' denotes a portion of the flux tank 222 facing the same direction in which the flux tank 222 is moved and the term 'rear portion' denotes a portion opposite to the front portion and, thus, faces the opposite direction to the direction that the flux tank 222 is moved. That is, the flux F may be non-uniformly distributed in the flux tank 222 at the first and the second standby areas 221b and 221c. Therefore, the flux level obtained by first reflective waves, which may be reflected from the first reflection position R1, may be more likely to indicate actual flux residuals in the flux tank 222 as the first reflection position R1 is at a middle portion of the flux tank 222. However, the flux levels obtained by second and third reflective waves, which may be reflected from the second and third reflection positions R2 and R3, respectively, may be more likely to get out of the actual flux residuals in the flux tank 222 since the reflection positions R2 and R3 are at the front and rear positions, respectively, of the flux tank 222.

Since the time when the reflective waves may reach the wave receiver may be varied based on the reflection positions in the flux tank 222, the first signal indicating the level of the flux residuals in the flux tank 222 may have different intensities according to the reflective waves that are reflected from different reflection positions. That is, a plurality of first signals may be detected from various reflection positions in the flux tank 222 by the detection section 251a. Then, the plurality of the first signals may be transferred to the signal analyzer 254 and may be processed by various signal processes, to thereby determine an optimal flux level which indicates the flux residuals most similar to the actual flux residuals in the flux tank 222.

In another example embodiment of the present inventive concepts, the level sensor 251 may further include a supplementary guide section that may be secured to the flux tank 222 and may move together with the flux tank 222.

Figure 7:
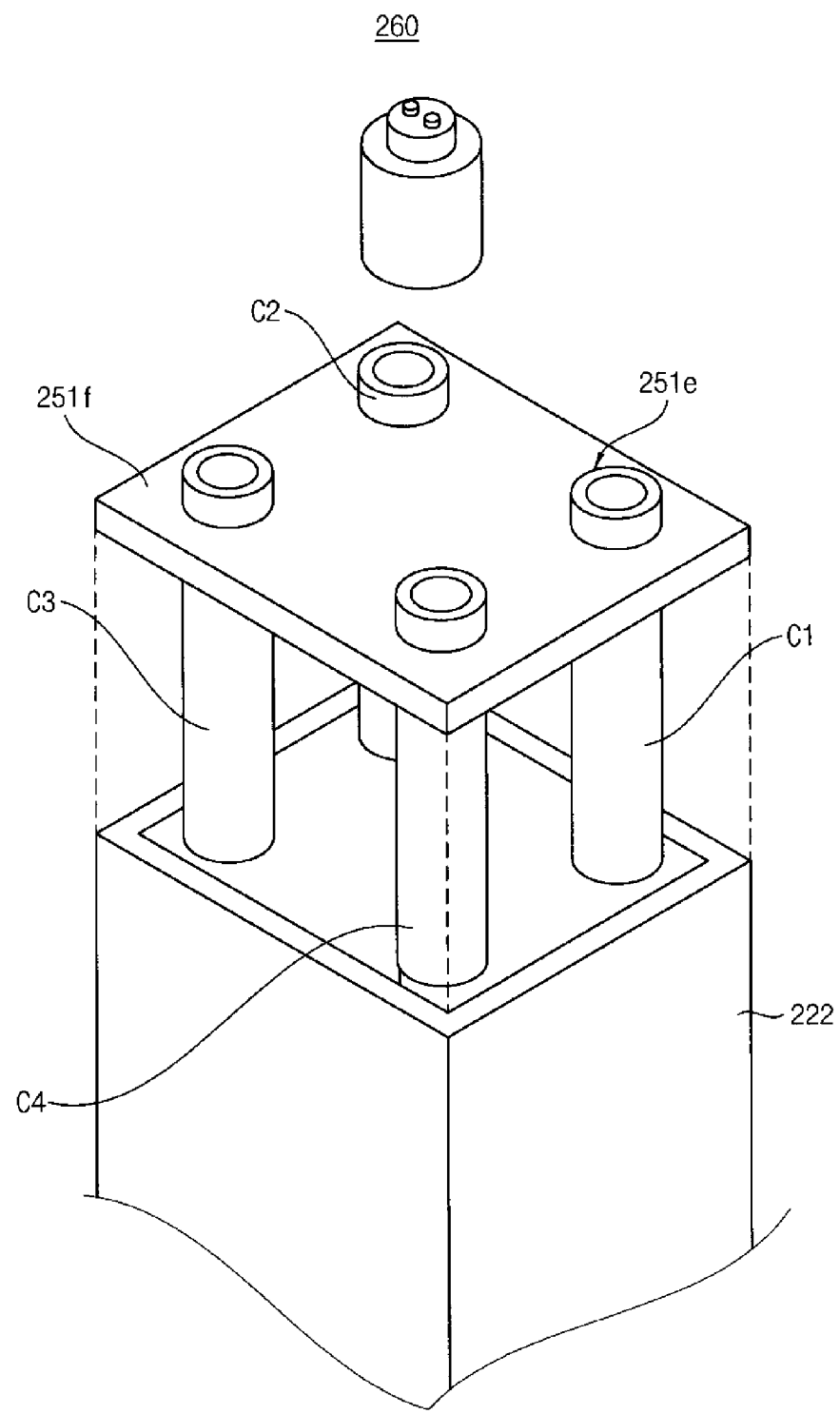
FIG. 7 is a perspective view illustrating another example embodiment of the level sensor of FIG. 5 in accordance with an example embodiment of the present inventive concepts.

FIG. 7 is a perspective view illustrating another example embodiment of the level sensor 251 of FIG. 5 in accordance with an example embodiment of the present inventive concepts. The example embodiment of the level sensor 260 of FIG. 7 may have substantially the same structure as the level sensor 251 of FIG. 5, except that the level sensor 260 includes a supplementary guide unit.

Referring to FIG. 7, the level sensor 260 may further include a supplementary plate 251f arranged over the flux tank 222 and a supplementary guide section 251e penetrating through the supplementary plate 251f. The level sensor 260 may be configured in such a way that the supplementary guide section 251e may be connected with the guide section 251c of each of the first and the second ultrasonic sensors 2511 and 2512 when the flux tank 222 is positioned at the first or the second standby area 221b or 221c, respectively.

Thus, the ultrasonic waves may be sent onto the flux F in the flux tank 222 through the guide section 251c and the supplementary guide section 251e. For example, the supplementary guide section 251e may include four cylinders C1, C2, C3 and C4 that may be located at four corner portions of the rectangular flux tank 222.

When the flux tank 222 is positioned at the first or the second standby area 221b or 221c, the level sensor 260 may be aligned with each of the supplementary guide units 251e and may send the ultrasonic waves onto the flux F and receive the reflective waves, respectively, to thereby obtain four flux levels at four different positions in the flux tank 222. For example, the guide section 251c may be connected to the first cylinder C 1 of the supplementary guide section 251e, and, thus, a first flux level may be obtained from a first position in the flux tank 222 that is exposed through the first cylinder C1. Then, the head section 251b may control the guide section 251c to connect with the second cylinder C2 of the supplementary guide section 251e, and, thus, a second flux level may be obtained from a second position in the flux tank 222 that is exposed through the second cylinder C2. In the same way, third and fourth flux levels may be obtained from third and fourth positions in the flux tank 222 that are exposed through the third and the fourth cylinders C3 and C4, respectively. In the present example embodiment, an average of the first, second, third and fourth flux levels may be selected as the optimal flux level, thereby increasing the accuracy of the optimal flux level.

While a pair of the ultrasonic sensors 2511 and 2512 may be secured to the first and the second columns adjacent to the first and the second standby areas 221b and 221c as the level sensor 251, a single ultrasonic sensor may be provided at one of the first and the second standby areas 221b and 221c.

In addition, the ultrasonic sensor 2511 and 2512 of the level sensor 251 may be secured to the flux tank 222 rather than the columns adjacent to the first and second standby areas 221b and 221c, and, thus, the level sensor 251 may move together with the flux tank 222. In such an embodiment, the level sensor 251 may also detect how much of the flux is filled into the coating bath 221a during the movement of the flux tank 222 between the first standby area 221b and the second standby area 221c.

While the present example embodiment discloses the ultrasonic sensor is the level sensor 251, any other sensors may also be used as the level sensor 251, as long as the sensor detects the level of a viscous fluid in the flux tank event through the upper surface of the viscous fluid is non-uniform according to the velocity and moving direction of the flux tank 222.

The amplifier 252 may receive the first signal from the level sensor 251, amplify the first signal indicating the level of the flux F in the flux tank 222, and output the amplified signal to the signal analyzer 254. Thus, the first signal may be efficiently processed in the signal analyzer 254 and the flux level may be clearly displayed on a visual terminal such as a display device.

Referring to FIG. 4, the state sensor 253 may detect the second signal indicating the operation conditions and states of the flux tank 222. For example, when the flux tank 222 is positioned at the first and the second standby areas 221b and 221c, a standby signal, which may indicate the arrival of the flux tank 222 to the first and the second standby areas 221b and 221c, may be detected by the state sensor 253 and may be transferred to the signal analyzer 254. In addition, various operation conditions and states such as the velocity of the flux tank 222 and operation conditions of the tank driver may be detected as the second signal by the state sensor 253. The elements of the second signal may be varied according to the structure of the flux coater 220 and the chip mounting apparatus 500.

The signal analyzer 254 may analyze the first and the second signals and may determine the flux residuals in the flux tank 222 by using the analysis results. In addition, the signal analyzer 254 may also determine whether or not it is necessary to supplement the flux into the flux tank 222 based on the flux residuals.

As described above, although the detection section 251a and the guide section 251c may be fixed in the flux coater 220, a plurality of the first signals may be detected from various reflection positions in the flux tank 222 and the flux levels obtained from each of the first signals may digress from the level of the actual flux residuals in the flux tank 222. In such a case, the signal analyzer 254 may process the plurality of the first signals and may generate a single optimal signal indicating the optimal flux level of the flux tank 222.

For example, the first signals may be given different weight depending on the velocity of the flux tank 222, the viscosity of the flux F and the gap distance between the first standby area 221b and the second standby area 221c. In the present example embodiment, weight of zero may be allocated to a maximal first signal and a minimal first signal and, thus, the maximal and minimal signals may not be used in the generation of the optimal signal. An arithmetical average of the remaining first signals, that is, excluding the maximal and minimal signals, may be used as the optimal signal indicating the optimal flux level. That is, all of the first signals except for the maximal and minimal signals may be treated as effective signals. In a case in which the first signals are given much more accurate weight by various statistical processes, the optimal flux level may have much more accuracy with respect to the actual flux level in the flux tank 222.

The detection section 251a and the guide section 251c may be rearranged at different positions and the first signals may be detected from the reflection positions of each of the different positions of the detection section 251a and the guide section 251c. Then, the first signals may be processed by various statistical methods, to, thereby, generate the optimal signal indicating the optimal flux level. For example, the ultrasonic waves may be sent to various positions of the upper surface of the flux F in the flux tank 222 by changing the position of the piezo-electric resonator and the configuration of the guide section 251c. A plurality of the first signals may be detected from various reflection positions in the flux tank 222 and the arithmetic average of the first signals may be used as the optimal signal for generating the optimal flux level. Therefore, the error between the optimal flux level and the active flux level may be minimized by statistically processing the first signals.

The generated optimal flux level and a preset reference flux level may be transferred to the control signal generator 255. The control signal generator 255 determines whether it is necessary to supplement the flux into the flux tank 222. Thus, a pair of the optimal flux level and the reference flux level may function as a determination factor of the flux supplementation.

In addition, the second signal may be selectively processed in the signal analyzer 254. For example, the second signal may indicate source data such as a relative position of the flux tank 222 with respect to the body 221, a moving velocity of the flux tank 222 and/or a tank size and processing data obtained by processing the sources data. The second signal may be transferred to the control signal generator 255 as state factors of the flux tank 222.

The control signal generator 255 may periodically display the determination factors for the supplemental flux and the state factors of the flux tank 222 and may generate a proper control signal when related conditions may be satisfied.

In the present example embodiment, the flux coater 220 may be stopped when a predetermined interrupt condition occurs. For example, when the flux tank 222 moves at a velocity higher than a reference speed or the operation states of the tank driver are broken away out of the normal states, the flux coater 220 may be controlled such that the flux coater is stopped. In a case in which the level sensor 251 is installed on the flux tank 222 such that the level sensor 251 moves together with the flux tank 222, the flux coater 220 may also be stopped when the level sensor detects that no flux is supplied to the coating bath 221a from the flux coater 220 during the movement of the flux tank 222.

In addition, when the optimal flux level is below the reference level, the control signal generator 255 may generate the flux supplemental signal and, thus, the flux may be automatically supplemented into the flux tank 222. Thus, the solder balls of the semiconductor chips C may be sufficiently coated with the flux F and insufficient coating of the solder balls may be prevented. For example, when the flux tank 222 is positioned at one of the first and the second standby areas 221b and 221c and the optimal flux level is under the reference level, flux may be supplemented into the flux tank through a supply nozzle (not illustrated).

Therefore, the flux residuals may be kept at a level equal to or higher than the reference level in the flux tank 222 by using the flux controller 250, thereby preventing the mounting of the semiconductor chips C onto the circuit board P with insufficient coating of the solder balls with the flux.

Referring to FIG. 1, the semiconductor chips C having the solder balls that are sufficiently coated with the flux F may be picked up by the chip picker 236 and may be located on the corresponding mounting areas A of circuit board P by the combining unit 200. Thus, a preliminary mounted chip in which the semiconductor chips C are temporarily combined with the circuit board P by the flux F is provided. Then, the preliminary mounted chip may be transferred to the bonding unit 300 in which the solder bumps of the semiconductor chips C may be bonded to the contact pad of the circuit board P with high reliability. That is, the semiconductor chips C may be firmly and stably bonded to the circuit board P by the bonding unit 300. Thus, a preliminary mounded chip in which the semiconductor chips C may be stably mounted onto the circuit board P are provided.

Figure 8:
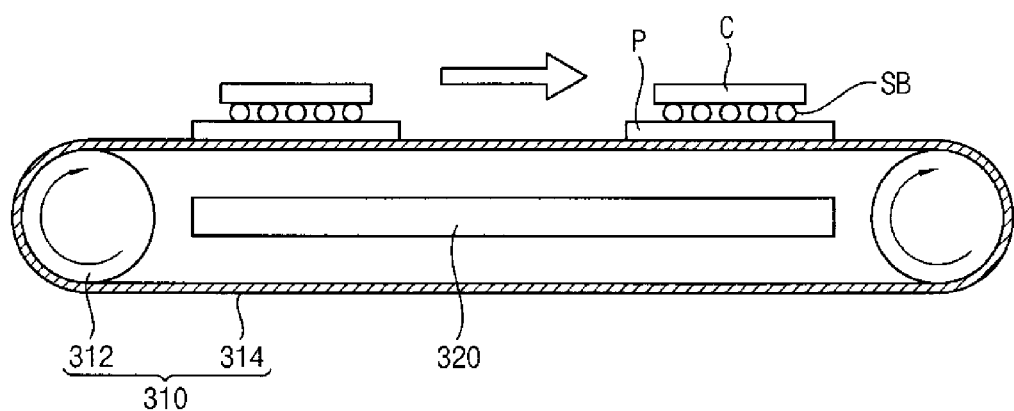
FIG. 8 is a structural view illustrating a bonding unit of the chip mounting apparatus of FIG. 1 in accordance with an example embodiment of the present inventive concepts.

FIG. 8 is a structural view illustrating the bonding unit 300 of the chip mounting apparatus 500 of FIG. 1 in accordance with an example embodiment of the present inventive concepts.

Referring to FIG. 8, the bonding unit 300 may include a bonding transfer 310 for moving the preliminary mounted chip during a reflow process and a heater 320 for performing the reflow process on the preliminary mounted chip.

For example, the bonding transfer 310 may include a roller 312 rolling with respect to a central axis of the roller 312 and a conveyer belt 314 driven by the roller 312. The conveyer belt 314 may be connected to the board rail 211 of the combining unit 200, and, thus, the preliminary mounted chip may be transferred and fixed to the conveyer belt 314 from the board rail 211.

The conveyer belt 314 may move according to the rolling of the roller 312 and the preliminary mounted chip may move at a speed of the conveyer belt 314 toward the unloading unit 400. The heater 320 may heat the solder bumps of the preliminary mounted chip while the conveyer belt 314 moves the preliminary mounted chip to a first board carrier 410 of the unloading unit 400. Therefore, the solder bumps of the preliminary mounted chip may be melted and, thereafter, may be sufficiently bonded to the contact pad of the circuit board P by the reflow process during the transfer of the preliminary mounted chip on the conveyer belt 314. Thus, a mounted chip CP in which the semiconductor chips C are firmly bonded to the circuit board P are provided.

As illustrated in FIG. 1, the unloading unit 400 may unload the mounted chip CP on the circuit board P from the chip mounting apparatus 500. For example, the mounted chip CP may be transferred to a second board carrier 420 such as a magazine from the bonding unit 300. When a plurality of the mounted chips CP are stacked in the second board carrier 420, the second board carrier CP may be transferred to a next stage for manufacturing a semiconductor package.

According to the example embodiment of the chip mounting apparatus 500 of the present inventive concepts, the flux residuals of the flux tank 222 may be automatically detected by the level sensor 251 and the flux F may be automatically supplemented into the flux tank 222 in a case in which the flux residuals are below the reference amount of the flux F. Thus, the solder ball of the semiconductor chips may be prevented from being insufficiently coated with the flux and, thus, failures as a result of insufficient bonding between the solder balls of the semiconductor chips C and the contact pads of the circuit board P in the semiconductor package may be prevented. Particularly, the conventional manual investigation of the flux residuals of the flux tank and the supplement of the flux into the flux tank may be replaced with the automatic flux residual analysis and flux supplementation by the level sensor 251 and the supplemental flux signal, to thereby minimize the flux coating failures in mounting the semiconductor chips C onto the circuit board P.

FIG. 9 is a flow chart illustrating processing steps for a method of mounting the semiconductor chips onto a circuit board using the chip mounting apparatus 500 of FIG. 1 in accordance with an example embodiment of the present inventive concepts. FIG. 10 is a flow chart illustrating processing sub-steps for a step of supplementing the flux into the flux tank of FIG. 9 in accordance with an example embodiment of the present inventive concepts.

Referring to FIGS. 1, 9 and 10, the circuit board P, in which the contact pads are arranged, and the semiconductor chips C, in which a plurality of the solder balls are arranged, may be loaded into the chip mounting apparatus 500 of FIG. 1 by the loading unit 100. The circuit board P may include an inner circuit pattern and a plurality of contact pads that may be connected to the inner circuit pattern and the semiconductor chip C may include a flip chip in which a plurality of contact terminals, for example, solder bumps, may be arranged on an active face of an integrated circuit chip.

The circuit board P may be loaded onto the board transfer 113, for example, the conveyer belt, from the first board carrier 111, for example, a magazine, and may be transferred and secured onto the board support 210 of the combining unit 200 (step S100).

The semiconductor chips C may be separated from each other by a sewing process on a wafer and may be adhered to one another by a UV-ray adhesion tape on the wafer. Thus, the semiconductor chips C may be loaded into the chip mounting apparatus 500 arranged on the wafer. For example, the wafer W having a plurality of the semiconductor chips C may be received by the wafer carrier 151, for example, a wafer cassette, and the wafer carrier 151 may be moved toward the chip mounting apparatus 500. Then, the wafer W may be extracted and transferred onto the wafer support 155 by the wafer extractor 153, for example, a robot arm, one by one, and the adhesion of the UV-ray tape may be reduced by illuminating the UV-ray to the wafer W. Thus, the semiconductor chips C on the wafer W may be untied from one another.

Then, the flux tank 222 may be moved across the coating bath 221a from the first standby area 221b to the second standby area 221c of the body 221 while supplying the flux F into the coating bath 221a and planarizing an upper surface of the flux F in the coating bath 221a (step S200). Thus, the coating bath 221a may be filled up with the flux F in such a way that an upper surface flux F in the coating bath 221a is coplanar with an upper surface of the body 221. Therefore, when the flux tank 222 arrives at the second standby area 221c, the flux F remaining in the flux tank 222 may be detected as the flux residuals.

The semiconductor chips C may be individually picked up from the wafer W and the contact terminals, for example, solder balls, of the semiconductor chips C may be dipped into the flux F of the coating bath 221a, thereby coating the solder balls with the flux F (step S300).

When the solder balls of the semiconductor chips C are coated with the flux F in the coating bath 221a, the flux residuals may be detected by the level sensor 251 and the flux may be supplemented into the flux tank 222, when the amount of the flux residuals is below the reference amount of the flux (step S400).

For example, referring to FIG. 10, the ultrasonic waves may be sent into the flux tank 222 from the level sensor 251 that may be arranged over the flux tank 222 (step S410). The reflective waves reflected from various reflection positions in the flux tank 222 are detected thereby obtaining first signals, each of which indicates a flux level of the flux residuals in the flux tank 222 (step S420). Thereafter, maximal and minimal values of the first signals may be excluded and the arithmetic average of the remaining first signals may be selected as the optimal signal and the optimal flux level may be generated by processing the optimal signal (step S430). The second signal indicating operation conditions and states of the flux tank 222 may be detected by the state sensor 253 (step S440). For example, the second signal may indicate the position, the moving speed and the size of the flux tank 222. When the flux tank 222 is positioned at the first and the second standby areas 221b and 221c and the detected flux level is below the reference level, the flux supplemental signal may be generated from the control signal generator 255 such that supplemental flux is provided to the flux tank 222(step S450).

When the coating of the solder balls with the flux F is completed, the semiconductor chips C may be individually picked up from the coating bath 221a and may be transferred onto the circuit board P secured to the board support 210 by the chip picker 236 in such a way that the solder balls of the semiconductor chips C may be aligned with the mounting areas A of the circuit board P and the solder balls or contact terminals of the semiconductor chips C may be temporarily combined with the contact pads of each of mounting areas A by the flux F, respectively (step S500). Thus, the preliminary mounted chip in which the semiconductor chips C are temporarily combined with the circuit board P at the mounting areas A thereof are provided.

Then, the preliminary mounted chip may be transferred to the bonding unit 300 and a heat treatment such as a reflow process may be performed on the preliminary mounted chip in the bonding unit 400. Thus, the solder balls of the semiconductor chips C may be firmly and stably bonded to the contact pads of the circuit board P by the reflow process, thereby providing the mounted chip CP (step S600).

Thereafter, the mounted chip CP may be stacked on the second board carrier 420 of the unloading unit 400 and the second board carrier 420 may be moved to a next stage for manufacturing a semiconductor package using the mounted chip CP. That is, the mounted chip CP may be unloaded from the chip mounting apparatus 500 by the unloading unit 400.

According to the example embodiments of the method of mounting chips on the circuit board of the present inventive concepts, the level of the flux residuals in the flux tank may be determined by using the level sensor that may be arranged over the flux tank. When the detected flux level of the flux residuals is below the preset reference level, the flux may be automatically supplemented into the flux tank. In contrast, when the detected flux level of the flux residuals is over the preset reference level, the flux tank may still move across the coating bath without any supplementation of the flux. Thus, the flux tank may hold a sufficient flux in moving across the coating bath and the flux may be sufficiently supplied into the coating bath. Accordingly, insufficient coating of the solder balls of the semiconductor chip C with the flux F may be prevented.

Particularly, the flux residuals may be automatically detected by the level sensor using the ultrasonic waves, and the flux supplementation may be automatically performed by the control signal generator when the detected level is below the reference level rather than the conventional manual investigation of the flux residuals and manual supplementation of the flux. Thus, the flux coating failures and the contact failures of the semiconductor package caused by the flux coating failures may be remarkably reduced by the chip mounting apparatus of the present inventive concepts.

The present example embodiments of the memory device may be applied to various electronic systems including semiconductor devices and IC chips such as telecommunication systems and storage systems.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An apparatus for mounting semiconductor chips on a circuit board, comprising:
    a loading unit loading at least a circuit board and at least a plurality of semiconductor chips into the apparatus, the circuit board having an inner circuit pattern and a plurality of contact pads connected to the inner circuit pattern and the semiconductor chip having a plurality of contact terminals;
    a combining unit positioning the semiconductor chip onto a respective mounting area of the circuit board and combining the contact terminal of the semiconductor chip with the contact pad of the circuit board by using flux, the combining unit having a flux coater for coating the contact terminal with the flux and a flux controller for automatically supplementing the flux to the flux coater; and
    a bonding unit bonding the contact terminals of the semiconductor chip to the contact pads of the circuit board using a heat treatment,
    wherein the flux coater comprises:
        a body having a coating bath filled up with the flux that is coated on the contact terminals; and
        a flux tank holding the flux and moving across the coating bath between first and second standby areas of the body while supplying the flux to the coating bath,
    wherein the flux controller comprises:
        a level sensor over the flux tank adjacent to at least one of the first and second standby areas of the body detecting a flux level of flux residuals remaining in the flux tank as a first signal, and
    wherein the level sensor comprises:
        a detection section generating ultrasonic waves and detecting reflective ultrasonic waves reflected from an inside of the flux tank;
        a head section controlling the detection section;
        a guide section protruding from the head section in a direction along which the ultrasonic waves are sent thereby guiding the ultrasonic waves in the flux tank; and
        a supplementary plate positioned over the flux tank and at least one supplementary guide section penetrating through the supplementary plate, the supplementary guide section being connected with the guide section and guiding the ultrasonic waves to various areas in the flux tank.

2. The apparatus of claim 1, wherein the detection unit includes a piezo-electric resonator for generating the ultrasonic waves.

3. The apparatus of claim 1, wherein the flux controller comprises:
    a state sensor detecting operation conditions and states of the flux tank as a second signal;
    a signal analyzer analyzing the first and the second signals to thereby obtain the flux level and state information on the flux tank; and
    a control signal generator generating control signals for driving the flux tank and for supplementing the flux into the flux tank according to the flux level and the state information.

4. The apparatus of claim 3, wherein the flux level includes an optimal level obtained by analyzing a plurality of the first signals detected from various positions in the flux tank and the control signal for supplementing the flux is generated at a time when the optimal level is below a reference level that is a preset level of the flux in the flux tank, and
    wherein the state information of the flux tank comprises at least one of a relative position of the flux tank with respect to the body, a moving velocity of the flux tank across the coating bath between the first and the second standby areas of the body and a size of the flux tank.

5. The apparatus of claim 4, wherein the optimal level includes an arithmetic average of a plurality of the flux levels corresponding to the plurality of the first signals, respectively, except for a minimal flux level and a maximal flux level.

6. The apparatus of claim 1, wherein the combining unit further comprises:
    a board support onto which the circuit board is secured; and
    a chip aligner for aligning the semiconductor chip of which the contact terminals are coated with the flux in the coating bath onto the mounting areas of the circuit board, respectively, thereby combining the contact terminals of the semiconductor chips with the contact pads of the circuit board by using the flux.

7. The apparatus of claim 6, wherein the combining unit further comprises a mapping tool detecting the positions of the mounting areas and the positions of the contact terminals coated with the flux and mapping the mounting areas and the contact terminals one to one.

8. The apparatus of claim 6, wherein the board support includes a board rail connected with the loading unit and the bonding unit and along which the circuit board moves from the loading unit to the bonding unit and a board stopper installed on the board rail for temporarily stopping the circuit board while combining the semiconductor chips with the circuit board.

9. The apparatus of claim 1, wherein the bonding unit comprises:
    a bonding transfer transferring the circuit board having the combined semiconductor chips and circuit board; and
    a heater for performing a reflow process on the contact terminals with which the contact pads are combined by the flux.

10. An apparatus for mounting semiconductor chips on a circuit board, comprising:
- a combining unit positioning the semiconductor chip onto a respective mounting area of the circuit board and combining a contact terminal of the semiconductor chip with a contact pad of the circuit board using flux, the combining unit having a flux coater for coating the contact terminal with the flux and a flux controller for automatically supplementing the flux to the flux coater,
- wherein the flux coater comprises a flux tank holding the flux, and
- wherein the flux controller comprises a level sensor over the flux tank adjacent to at least one of the first and second standby areas of the body detecting a flux level of flux residuals in the flux tank such that, when the detected flux level of the flux residuals is below a preset reference level, the flux controller automatically supplements flux into the flux tank,
- wherein the level sensor comprises:
  - a detection section generating ultrasonic waves and detecting reflective ultrasonic waves reflected from an inside of the flux tank;
  - a head section controlling the detection section;
  - a guide section protruding from the head section in a direction along which the ultrasonic waves are sent thereby guiding the ultrasonic waves in the flux tank;
  - a supplementary plate positioned over the flux tank and at least one supplementary guide section penetrating through the supplementary plate, the supplementary guide section being connected with the guide section and guiding the ultrasonic waves to various areas in the flux tank.

11. The apparatus of claim 10, further comprising a bonding unit bonding the contact terminal of the semiconductor chip to the contact pad of the circuit board using a heat treatment.

12. The apparatus of claim 11, further comprising:
- a loading unit loading the circuit board and the semiconductor chip into the apparatus and providing the circuit board and semiconductor chip to the combining unit;
- an unloading unit unloading bonded semiconductor chip and circuit board from the bonding unit out of the apparatus.

13. The apparatus of claim 10, wherein the flux coater further comprises a body having a coating bath filled with the flux that is coated on the contact terminal, wherein the flux tank holding the flux moves across the coating bath between first and second standby areas of the body while supplying the flux to the coating bath.

* * * * *